(12) United States Patent
Cho et al.

(10) Patent No.: US 9,502,574 B2
(45) Date of Patent: Nov. 22, 2016

(54) THIN FILM TRANSISTOR AND MANUFACTURING METHOD THEREOF

(71) Applicant: SAMSUNG DISPLAY CO., LTD., Youngin, Gyeonggi-Do (KR)

(72) Inventors: Seung-Hwan Cho, Yeontong (KR); Young Ki Shin, Hwaseong-si (KR); Dong Hwan Shim, Yongin-si (KR); Yoon Ho Khang, Yongin-si (KR); Hyun Jae Na, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/249,329

(22) Filed: Apr. 9, 2014

(65) Prior Publication Data

US 2015/0069399 A1    Mar. 12, 2015

(30) Foreign Application Priority Data

Sep. 12, 2013 (KR) .................. 10-2013-0109888

(51) Int. Cl.
*H01L 29/786* (2006.01)
*H01L 29/66* (2006.01)

(52) U.S. Cl.
CPC ..... *H01L 29/7869* (2013.01); *H01L 29/66969* (2013.01); *H01L 29/78696* (2013.01)

(58) Field of Classification Search
None
See application file for complete search history.

(56) References Cited

U.S. PATENT DOCUMENTS

| 2011/0240998 | A1 | 10/2011 | Morosawa et al. |
| 2011/0241005 | A1* | 10/2011 | Ro et al. .......................... 257/59 |
| 2012/0025187 | A1* | 2/2012 | Park et al. ...................... 257/43 |
| 2012/0032180 | A1 | 2/2012 | Nagai et al. |
| 2014/0151708 | A1* | 6/2014 | Jeon et al. ...................... 257/72 |

FOREIGN PATENT DOCUMENTS

| KR | 10-1137391 B1 | 4/2012 |
| KR | 10-2012-0077288 A | 7/2012 |
| KR | 10-2013-0036136 A | 4/2013 |

* cited by examiner

*Primary Examiner* — Daniel Whalen
(74) *Attorney, Agent, or Firm* — Lewis Roca Rothgerber Christie LLP

(57) ABSTRACT

A thin film transistor includes: a first semiconductor layer; a second semiconductor layer disposed on the first semiconductor layer; and a pair of source region and drain region formed by doping both sides of the first semiconductor layer and the second semiconductor layer with impurities, and the source region includes a first source layer on the same plane as the first semiconductor layer and a second source layer on the same plane as the second semiconductor layer, and the drain region includes a first drain layer on the same plane as the first semiconductor layer and a second drain layer on the same plane as the second semiconductor layer, and only one of the first semiconductor layer and the second semiconductor layer is a transistor channel layer.

9 Claims, 12 Drawing Sheets

THIN FILM TRANSISTOR AND MANUFACTURING METHOD THEREOF

CROSS-REFERENCE TO RELATED APPLICATION

This application claims priority to and the benefit of Korean Patent Application No. 10-2013-0109888, filed in the Korean Intellectual Property Office on Sep. 12, 2013, the entire content of which is incorporated herein by reference.

BACKGROUND

1. Field

Embodiments of the present invention relate to a thin film transistor and a manufacturing method thereof.

2. Description of the Related Art

In recent years, various displays such as liquid crystal displays, plasma display panels, field emission displays, light emitting devices, organic light emitting displays, or the like have been commercialized.

The various displays are implemented by driving a plurality of light emitting elements in a matrix with a plurality of thin film transistors.

The thin film transistor is configured by stacking a source electrode and a drain electrode, a semiconductor layer, and a gate electrode. As the thickness of the semiconductor layer decreases, operating characteristics of the thin film transistor are improved, in which a threshold voltage of the thin film transistor decreases, a distribution of the threshold voltage decreases, an operating current decreases, and the like.

However, as the thickness of the semiconductor layer decreases, contact resistance between the semiconductor layer and the source electrode, contact resistance between the semiconductor layer and the drain electrode, and sheet resistance of an inactive area that contacts the source electrode and the drain electrode in the semiconductor layer increase. As a result, a wiring resistance increases.

The above information disclosed in this Background section is only for enhancement of understanding of the background of the invention and therefore it may contain information that does not form the prior art that is already known in this country to a person of ordinary skill in the art.

SUMMARY

An aspect of the present invention is directed toward a thin film transistor utilizing an oxide semiconductor and a manufacturing method thereof. An aspect according to embodiments of the present invention is directed toward a thin film transistor having small sheet resistance and contact resistance, and a manufacturing method thereof.

According to an example embodiment of the present invention, a thin film transistor includes: a first semiconductor layer; a second semiconductor layer on the first semiconductor layer; and a pair of source region and drain region formed by doping both sides of the first semiconductor layer with impurities, and the source region includes a first source layer on the same plane as the first semiconductor layer and a second source layer on the same plane as the second semiconductor layer, and the drain region includes a first drain layer on the same plane as the first semiconductor layer and a second drain layer on the same plane as the second semiconductor layer, and only one of the first semiconductor layer and the second semiconductor layer is a transistor channel layer (a channel layer).

Cations of the first semiconductor layer and the second semiconductor layer may be the same as each other.

The thin film transistor may further include: a gate insulating layer on the second semiconductor layer; and a gate electrode on the gate insulating layer.

The second semiconductor layer may be the channel layer.

A carrier concentration of the first semiconductor layer may be lower than that of the second semiconductor layer.

The carrier concentration of the first semiconductor layer may be equal to or less than $1\ e^{15}/cm^3$ and the carrier concentration of the second semiconductor layer may be equal to or more than $1\ e^{17}/cm^3$.

A carrier concentration of the source region and the drain region may be equal to or more than $1\ e^{19}/cm^3$.

The first semiconductor layer may include an insulating material dopable with impurities.

The first semiconductor layer may function as a light blocking layer.

The thin film transistor may further include: a gate electrode; and a gate insulating layer on the gate electrode, and the first semiconductor layer may be on the gate insulating layer.

The first semiconductor layer may be the channel layer.

The carrier concentration of the first semiconductor layer may be higher than that of the second semiconductor layer.

The carrier concentration of the first semiconductor layer may be equal to or more than $1\ e^{17}/cm^3$ and the carrier concentration of the second semiconductor layer may be equal to or less than $1\ e^{15}/cm^3$.

The carrier concentration of the source region and the drain region may be equal to or more than $1\ e^{19}/cm^3$.

The second semiconductor layer may include (or be made of) an insulating material dopable with impurities.

The second semiconductor layer may function as a light blocking layer.

According to another example embodiment of the present invention, a manufacturing method of a thin film transistor includes: disposing a first semiconductor layer; disposing a second semiconductor layer on the first semiconductor layer; and forming a pair of source region and drain region by doping both sides of the first semiconductor layer and the second semiconductor layer with impurities, in which only one of the first semiconductor layer and the second semiconductor layer is a transistor channel layer (a channel layer).

Cations of the first semiconductor layer and the second semiconductor layer may be the same as each other.

A carrier concentration of the one of the first semiconductor layer and the second semiconductor layer which becomes the channel layer may be higher than that of the other one of the first semiconductor layer and the second semiconductor layer.

The other one of the first semiconductor layer and the second semiconductor layer which does not become the channel layer may include (or be made of) an insulating material dopable with impurities.

As such, according to embodiments of the present invention, while improving a characteristic of a thin film transistor by decreasing a magnitude and a distribution of the threshold voltage, the operating current of the thin film transistor and sheet resistance and contact resistance of the thin film transistor may also be decreased.

DETAILED DESCRIPTION

Figure 1:
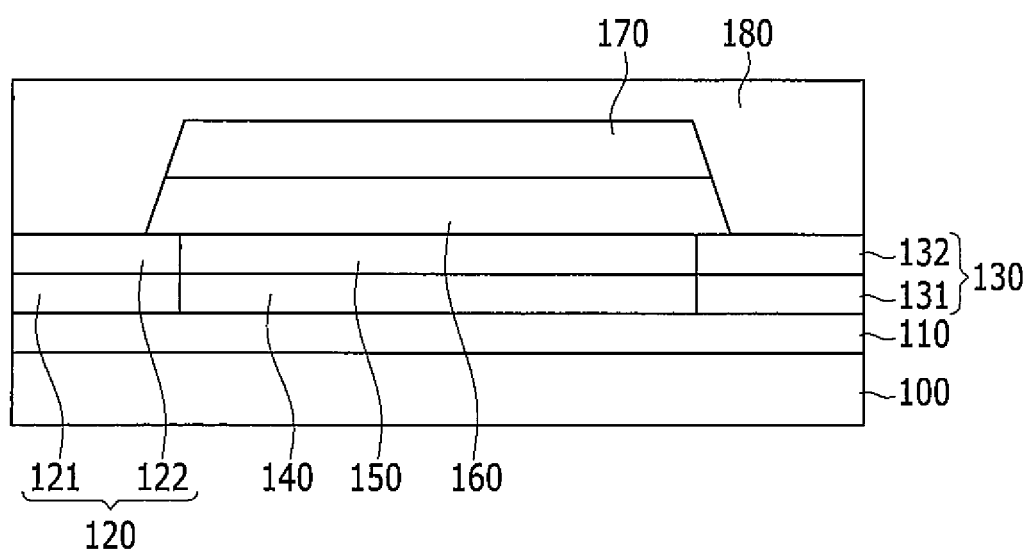
FIG. 1 is a cross-sectional view illustrating a thin film transistor according to an example embodiment of the present invention.

Embodiments of the present invention will be described more fully hereinafter with reference to the accompanying drawings, in which example embodiments of the invention are shown. As those skilled in the art would realize, the described embodiments may be modified in various different ways, all without departing from the spirit or scope of the present invention.

Further, in the example embodiments, since like reference numerals designate like elements having the same configuration, a first example embodiment is representatively described, and in other example embodiments, only a configuration different from the first example embodiment will be described.

The drawings and description are to be regarded as illustrative in nature and not restrictive, and like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present. Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a cross-sectional view illustrating a thin film transistor according to an example embodiment of the present invention.

Referring to FIG. 1, a thin film transistor according to an example embodiment is a top-gate thin film transistor in which a gate electrode 170 is disposed above a source region 120 and a drain region 130.

The thin film transistor includes a substrate 100, a buffer layer 110 disposed on the substrate 100, a pair of source region 120 and drain region 130 disposed on the buffer layer 110, a first semiconductor layer 140 disposed on the buffer layer 110 between the source region 120 and the drain region 130, a second semiconductor layer 150 disposed on the first semiconductor layer 140 between the source region 120 and the drain region 130, a gate insulating layer 160 disposed on the second semiconductor layer 150, and a gate electrode 170 disposed on the gate insulating layer 160. A passivation layer 180 may be disposed on the source region 120, the drain region 130, and the gate electrode 170.

The substrate 100 may be made of transparent glass, plastic, or the like.

The buffer layer 110 is disposed to block an influence of impurities from the substrate 100. The buffer layer 110 may be made of an inorganic insulating material such as silicon nitride (SiNx) or silicon oxide (SiOx).

The pair of source region 120 and drain region 130 are spaced apart from each other on the substrate 100. The source region 120 includes a first source layer 121 disposed on the buffer layer 110 and a second source layer 122 disposed on the first source layer 121. The drain region 130 includes a first drain layer 131 disposed on the buffer layer 110 and a second drain layer 132 disposed on the first drain layer 131.

The first source layer 121 and the first drain layer 131 are formed without a step from the first semiconductor layer 140. That is, the first source layer 121, the first drain layer 131, and the first semiconductor layer 140 form one coplanar layer.

The second source layer 122 and the second drain layer 132 are formed without a step from the second semiconductor layer 150. That is, the second source layer 122, the second drain layer 132, and the second semiconductor layer 150 form one coplanar layer.

Here, the first semiconductor layer 140 is formed of an oxide semiconductor which is not doped with impurities, and the second semiconductor layer 150 (formed on the first semiconductor layer 140) is also formed of an oxide semiconductor which is not doped with impurities, and thereafter, both sides (i.e., the left side and the right side) of the first semiconductor layer 140 and the second semiconductor layer 150 are doped with impurities to form the first source layer 121, the second source layer 122, the first drain layer 131, and the second drain layer 132. That is, both sides of the first semiconductor layer 140 and the second semiconductor layer 150 are doped with impurities to form the source region 120 and the drain region 130. Such an impurity may be an N-type impurity or a P-type impurity according to a kind of the thin film transistor.

The oxide semiconductor may include any one of suitable oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

The first semiconductor layer 140 and the second semiconductor layer 150 may be made of any one of the suitable oxide semiconductors. Here, primary components of the first semiconductor layer 140 and the second semiconductor layer 150 may be the same as each other. Cations of the first semiconductor layer 140 and the second semiconductor layer 150 may be the same as each other. The first semiconductor layer 140 and the second semiconductor layer 150 may be transparent.

As one example, the second semiconductor layer 150 may be made of indium-gallium-zinc oxide (lnGaZnO$_4$), and the first semiconductor layer 140 may be made of materials having the same primary component or the same cation as the indium-gallium-zinc oxide (lnGaZnO$_4$) in the second semiconductor layer 150 among the oxide semiconductors.

A carrier concentration of the first semiconductor layer 140 is lower than that of the second semiconductor layer 150. For example, the carrier concentration of the first semiconductor layer 140 may be equal to or less than 1 e$^{15}$/cm$^3$, and the carrier concentration of the second semiconductor layer 150 may be equal to or more than 1 e$^{17}$/cm$^3$. Alternatively, the carrier concentration of the first semiconductor layer 140 may be less than 1 e$^{17}$/cm$^3$, and the carrier concentration of the second semiconductor layer 150 may be equal to or more than 1 e$^{17}$/cm$^3$. Carrier concentrations of the source region 120 and the drain region 130 doped with the impurities may be equal to or more than 1 e$^{19}$/cm$^3$.

Also, the first semiconductor layer 140 may be made of an insulating material which is dopable with the impurities. For example, the first semiconductor layer 140 may be made of an insulating material based on zinc oxide (ZnO). That is, the first semiconductor layer 140 may be formed of the insulating material which is dopable with the impurities, and the second semiconductor layer 150 may be formed on the first semiconductor layer 140 by an oxide semiconductor which is not doped with impurities, and thereafter, both sides of the first semiconductor layer 140 and the second semiconductor layer 150 are doped with impurities to form the first source layer 121, the second source layer 122, the first drain layer 131, and the second drain layer 132. Since the first semiconductor layer 140 is made of the insulating material which is dopable with the impurities, the carrier concentrations of the first source layer 121 and the first drain layer 131 may be impurity doped to have equal to or more than 1 e$^{19}$/cm$^3$ in carrier concentration.

Further, the first semiconductor layer 140 may be made of a semiconductor which is dopable with the impurities or a material which is the insulating material and serves as a light blocking layer. For example, the first semiconductor layer 140 may be made of manganese oxide (MnxOy), silicon-germanium (SiGe), or the like.

The gate insulating layer 160 is disposed on the second semiconductor layer 150 to insulate the second semiconductor layer 150 and the gate electrode 170 from each other. The gate insulating layer 160 may be made of an inorganic insulating material such as silicon nitride (SINx) or silicon oxide (SiOx).

The gate electrode 170 is disposed on the gate insulating layer 160. The gate electrode may be made of a metal such as aluminum (Al), molybdenum (Mo), copper (Cu), molybdenum tungsten (MoW), titanium (Ti), copper (Cr), or the like. Alternatively, the gate electrode 170 may be made of an electro-conductive transparent material such as indium tin oxide (ITO), indium zinc oxide (IZO), or the like.

The passivation layer 180 is disposed on the source region 120, the drain region 130, and the gate electrode 170. The passivation layer 180 may be disposed to protect the oxide semiconductor which is vulnerable to an external environment such as a high temperature, or the like. The passivation layer 180 may be made of an inorganic insulating material such as silicon nitride (SiNx), silicon oxide (SiOx), or the like.

In the thin film transistor configured as above, when a voltage which is equal to or more than a threshold of the thin film transistor is applied to the gate electrode 170 (that is, when the thin film transistor is in an on state), current that flows between the source region 120 and the drain region 130 flows through the second semiconductor layer 150 without passing through the first semiconductor layer 140. The reason is that the carrier concentrations of the first semiconductor layer 140 and the second semiconductor layer 150 are different from each other. That is, the second semiconductor layer 150 (with a higher carrier concentration) becomes a transistor channel layer (a channel layer) that forms a channel of the thin film transistor.

The thickness of the second semiconductor layer 150 may be formed to be equal to or less than 200 Å, and as the channel layer is formed to be thin (with 200 Å or less), the threshold voltage of the thin film transistor and a distribution thereof decrease, and the operating current of the thin film transistor decreases. As a result, the channel of the thin film transistor may be implemented to be short.

Meanwhile, the thickness of the first semiconductor layer 140 may be equal to or larger than that of the second semiconductor layer 150. That is, the thickness of the second semiconductor layer 150 may be equal to or smaller (less) than that of the first semiconductor layer 140. The thickness of each of the source region 120 and the drain region 130 is equal to a thickness acquired by adding the thicknesses of the first semiconductor layer 140 and the second semiconductor layer 150. That is, the thickness of each of the source region 120 and the drain region 130 is larger than that of the channel layer alone (i.e., the portion of the second semiconductor layer 150 that becomes the channel layer). As a result, sheet resistance and contact resistance of the source region 120 and the drain region 130 decrease.

Hereinafter, a manufacturing method of the top-gate thin film transistor proposed with reference to FIGS. 2 to 5 will be described.

FIGS. 2 to 5 are process cross-sectional views illustrating a manufacturing method of a thin film transistor according to an example embodiment of the present invention.

Figure 2:
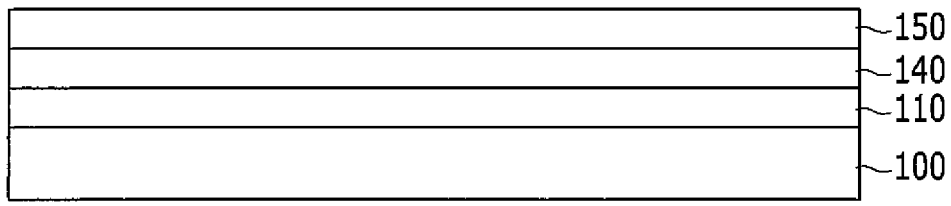
FIGS. 2 to 5 are process cross-sectional views illustrating a manufacturing method of a thin film transistor according to an example embodiment of the present invention.

Referring to FIG. 2, the buffer layer 110, the first semiconductor layer 140, and the second semiconductor layer 150 are sequentially stacked on the substrate 100. The buffer layer 110, the first semiconductor layer 140, and the second semiconductor layer 150 may be stacked utilizing a deposition method such as physical vapor deposition (PVD), chemical vapor deposition (CVD), or the like.

In a manufacturing process of a display device including the thin film transistor, the first semiconductor layer 140 and the second semiconductor layer 150 may be patterned. In the patterning of the first semiconductor layer 140 and the second semiconductor layer 150, a photoresist layer may be formed on the second semiconductor layer 150, a photoresist pattern may be formed by performing an exposure process using a mask on the photoresist layer, and the first semiconductor layer 140 and the second semiconductor layer 150 may be etched by using the photoresist pattern as an etching mask.

Figure 3:
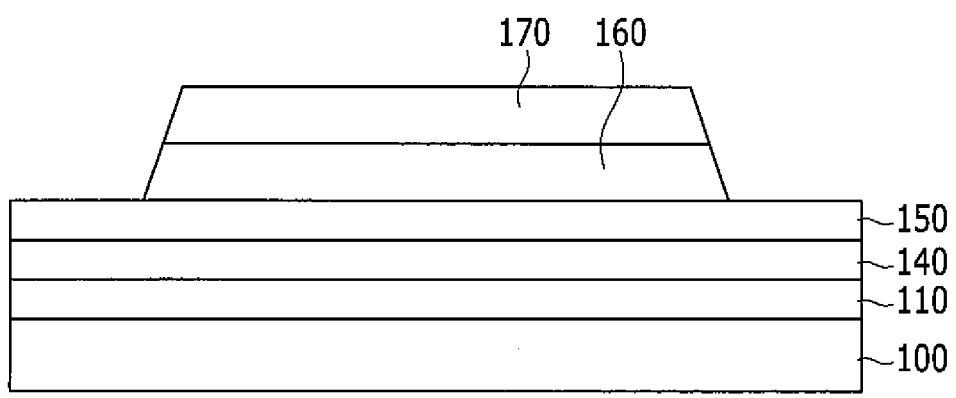

Referring to FIG. 3, the gate insulating layer 160 is formed on the second semiconductor layer 150, and the gate electrode 170 is patterned on the gate insulating layer 160. The insulating material for the gate insulating layer 160, the metal material for the gate electrode 170, and a second photoresist layer are sequentially stacked on the second semiconductor layer 150, the photoresist pattern is formed by performing the exposure process using a mask on the photoresist, and the gate electrode 170 may be patterned by etching the metal layer by using the photoresist pattern as the etching mask. The insulating material may be etched by using the gate electrode 170 as the mask, and as a result, the gate insulating layer 160 may be patterned according to a shape of the gate electrode 170 in a lower part of the gate electrode 170. As the gate insulating layer 160 is patterned, both ends of the second semiconductor layer 150 are exposed to the outside.

Figure 4:
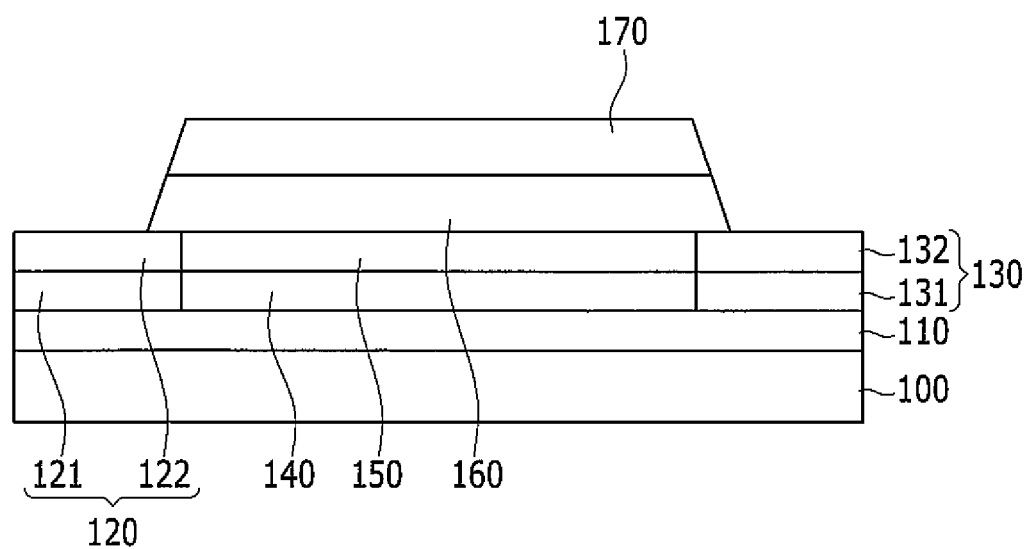

Referring to FIG. 4, the first source layer 121, the second source layer 122, the first drain layer 131, and the second drain layer 132 may be formed through at least one of a reducing reaction, a plasma processing reaction, and an impurity doping processing reaction onto an area exposed to the outside in the second semiconductor layer 150. That is, the source region 120 and the drain region 130 are thereby formed.

Figure 5:
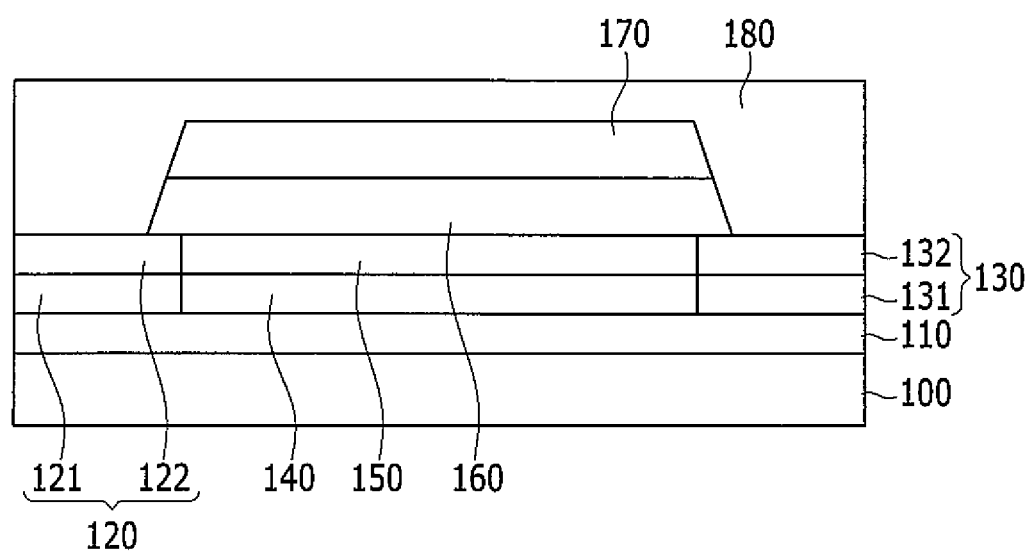

Referring to FIG. 5, the passivation layer 180 is disposed on the source region 120, the drain region 130, and the gate electrode 170. The passivation layer 180 which serves to protect an oxide semiconductor which is vulnerable to an external environment such as a high temperature, or the like, may be made of an inorganic insulating material such as silicon nitride (SiNx), silicon oxide (SiOx), or the like.

Figure 6:
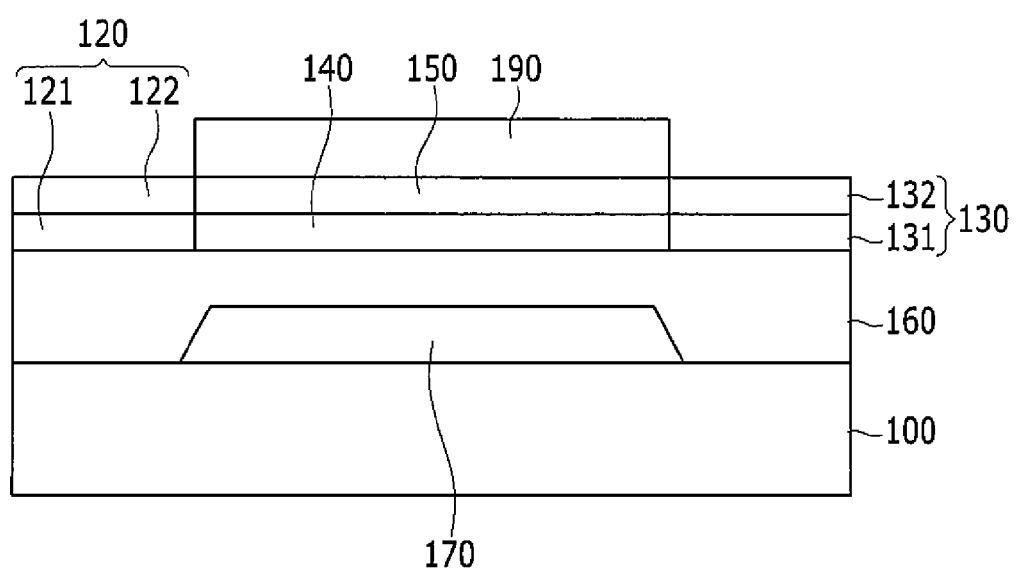
FIG. 6 is a cross-sectional view illustrating a thin film transistor according to another example embodiment of the present invention.

FIG. 6 is a cross-sectional view illustrating a thin film transistor according to another example embodiment of the present invention.

Referring to FIG. 6, a thin film transistor according to another example embodiment is a bottom-gate thin film transistor in which the gate electrode 170 is disposed below the source region 120 and the drain region 130.

The thin film transistor includes a substrate 100, a gate electrode 170 disposed on the substrate 100, a gate insulating layer 160, a pair of source region 120 and drain region 130 disposed on the gate insulating layer 160, a first semiconductor layer 140 disposed on the gate insulating layer 160 between the source region 120 and the drain region 130, a second semiconductor layer 150 disposed on the first semiconductor layer 140 between the source region 120 and the drain region 130, and an etch stopper 190 disposed on the second semiconductor layer 150.

The substrate 100 may be made of transparent glass, plastic, or the like.

The gate electrode 170 is disposed on the substrate 100. The gate electrode may be made of a metal such as aluminum (Al), molybdenum (Mo), copper (Cu), molybdenum tungsten (MoW), titanium (Ti), copper (Cr), or the like. Alternatively, the gate electrode 170 may be made of an electro-conductive transparent material such as indium tin oxide (ITO), indium zinc oxide (IZO), or the like.

The gate insulating layer 160 which serves to insulate the gate electrode 170 and the first semiconductor layer 140 thereabove from each other is formed on the substrate 100 to cover the gate electrode 170. The gate insulating layer 160 may be made of an inorganic insulating material such as silicon nitride (SiNx), silicon oxide (SiOx), or the like.

The pair of source region 120 and drain region 130 are spaced apart from each other on the gate insulating layer 160. The source region 120 includes a first source layer 121 disposed on the gate insulating layer 160 and a second source layer 122 disposed on the first source layer 121. The drain region 130 includes a first drain layer 131 disposed on the gate insulating layer 160 and a second drain layer 132 disposed on the first drain layer 131.

The first source layer 121 and the first drain layer 131 are formed without a step from the first semiconductor layer 140. That is, the first source layer 121, the first drain layer 131, and the first semiconductor layer 140 form one coplanar layer.

The second source layer 122 and the second drain layer 132 are formed without a step from the second semiconductor layer 150. That is, the second source layer 122, the second drain layer 132, and the second semiconductor layer 150 form one coplanar layer.

Here, the first semiconductor layer 140 is formed of an oxide semiconductor which is not doped with impurities, and the second semiconductor layer 150 (formed on the first semiconductor layer 140) is also formed of an oxide semiconductor which is not doped with impurities, and thereafter, both sides of the first semiconductor layer 140 and the second semiconductor layer 150 are doped with impurities to form the first source layer 121, the second source layer 122, the first drain layer 131, and the second drain layer 132. That is, both sides of each of the first semiconductor layer 140 and the second semiconductor layer 150 are doped with impurities to form the source region 120 and the drain region 130. Such an impurity may be an N-type (N-channel) impurity or a P-type (P-channel) impurity according to a kind of the thin film transistor.

The oxide semiconductor may include any one of suitable oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

The first semiconductor layer 140 and the second semiconductor layer 150 may be made of any one of the suitable oxide semiconductors. Here, primary components of the first semiconductor layer 140 and the second semiconductor layer 150 may be the same as each other. Cations of the first semiconductor layer 140 and the second semiconductor layer 150 may be the same as each other. The first semiconductor layer 140 and the second semiconductor layer 150 may be transparent.

As one example, the first semiconductor layer 140 may be made of indium-gallium-zinc oxide (InGaZnO$_4$), and the second semiconductor layer 150 may be made of materials having the same primary component or the same cation as the indium-gallium-zinc oxide (InGaZnO$_4$) in the first semiconductor layer 140 among the oxide semiconductors.

A carrier concentration of the first semiconductor layer 140 is higher than that of the second semiconductor layer 150. For example, the carrier concentration of the first semiconductor layer 140 may be equal to or more than 1

$e^{17}/cm^3$ and the carrier concentration of the second semiconductor layer 150 may be equal to or less than $1\ e^{15}/cm^3$. Alternatively, the carrier concentration of the first semiconductor layer 140 may be equal to or more than $1\ e^{17}/cm^3$ and the carrier concentration of the second semiconductor layer 150 may be less than $1\ e^{17}/cm^3$. Carrier concentrations of the source region 120 and the drain region 130 doped with the impurities may be equal to or more than $1\ e^{19}/cm^3$.

Also, the second semiconductor layer 150 may be made of an insulating material which is dopable with the impurities. For example, the second semiconductor layer 150 may be made of an insulating material based on zinc oxide (ZnO). That is, the first semiconductor layer 140 is formed of an oxide semiconductor which is not doped with impurities, and the second semiconductor layer 150 is formed on the first semiconductor layer 140 by the insulating material which is dopable with the impurities, and thereafter, both sides of the first semiconductor layer 140 and the second semiconductor layer 150 are doped with impurities to form the first source layer 121, the second source layer 122, the first drain layer 131, and the second drain layer 132. Since the second semiconductor layer 150 is made of the insulating material which is dopable with the impurities, the carrier concentrations of the second source layer 122 and the second drain layer 132 may be impurity doped to have equal to or more than $1\ e^{19}/cm^3$ in carrier concentration.

Further, the second semiconductor layer 150 may be made of a semiconductor which is dopable with the impurities or a material which is the insulating material and serves as a light blocking layer. For example, the second semiconductor layer 150 may be made of manganese oxide (MnxOy), silicon-germanium (SiGe), or the like.

The etch stopper 190 serves to prevent the carrier concentration of the channel layer from varying in a doping process of the first semiconductor layer 140 and the second semiconductor layer 150. The etch stopper 190 may be made of the insulating material.

In the thin film transistor configured as above, when a voltage which is equal to or more than a threshold of the thin film transistor is applied to the gate electrode 170 (that is, when the thin film transistor is in an on state), current that flows between the source region 120 and the drain region 130 flows through the first semiconductor layer 140 without passing through the second semiconductor layer 150. The reason is that the carrier concentrations of the first semiconductor layer 140 and the second semiconductor layer 150 are different from each other. That is, the first semiconductor layer 140 (with a higher carrier concentration) becomes a channel layer that forms a channel of the thin film transistor.

The thickness of the first semiconductor layer 140 may be formed to be equal to or less than 200 Å, and as the channel layer is formed to be thin (with 200 Å or less), the threshold voltage of the thin film transistor and a distribution thereof decrease, and the operating current of the thin film transistor decreases. As a result, the channel of the thin film transistor may be implemented to be short.

Meanwhile, the thickness of the second semiconductor layer 150 may be equal to or larger than that of the first semiconductor layer 140. That is, the thickness of the first semiconductor layer 140 may be equal to or smaller than that of the second semiconductor layer 150. The thickness of the source region 120 and the drain region 130 is equal to a thickness acquired by adding the thicknesses of the first semiconductor layer 140 and the second semiconductor layer 150. That is, in the thin-film transistor, the thickness of each of the source region 120 and the drain region 130 is larger than that of the channel layer alone (i.e., the portion of the first semiconductor layer 140 that becomes the channel layer). As a result, sheet resistance and contact resistance of the source region 120 and the drain region 130 decrease.

Hereinafter, a manufacturing method of the bottom-gate thin film transistor proposed with reference to FIGS. 7 to 9 will be described.

Figure 7:
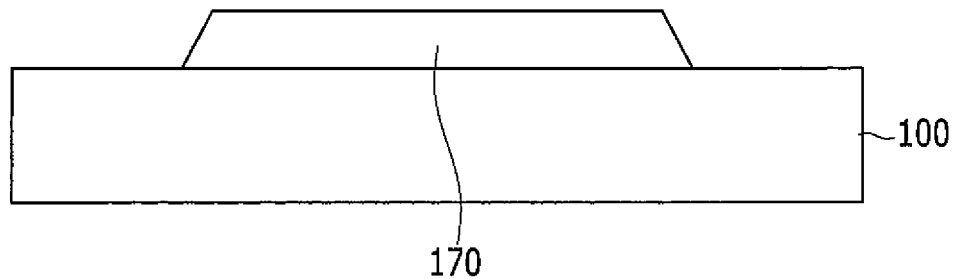
FIGS. 7 to 9 are process cross-sectional views illustrating a manufacturing method of a thin film transistor according to another example embodiment of the present invention.
Figure 8:
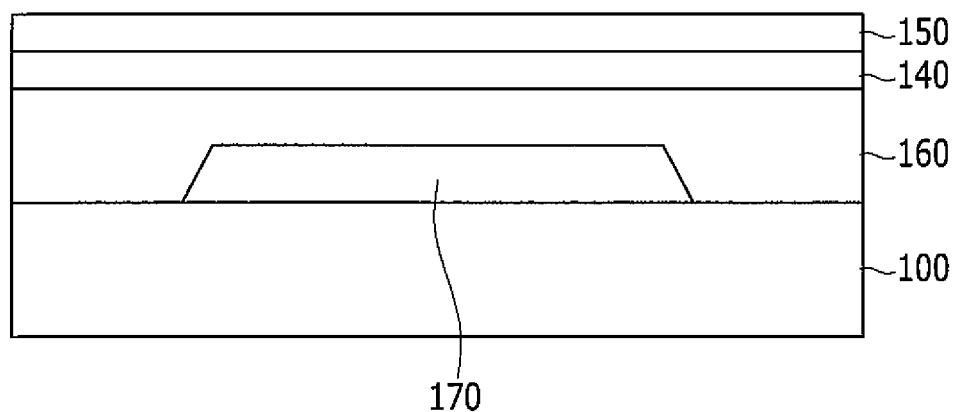
Figure 9:
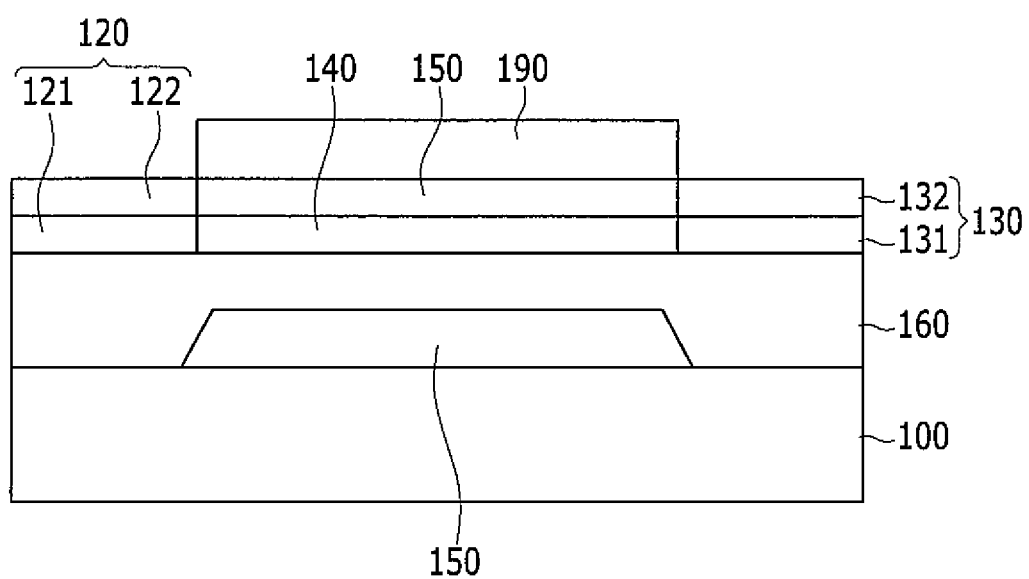

FIGS. 7 to 9 are process cross-sectional views illustrating a manufacturing method of a thin film transistor according to another example embodiment of the present invention.

Referring to FIG. 7, the gate electrode 170 is patterned on the substrate 100. The metal material for the gate electrode 170, and the photoresist are sequentially stacked on the substrate 100, the photoresist pattern is formed by performing the exposure process using a mask on the photoresist, and the gate electrode 170 may be patterned by etching the metal layer using the photoresist pattern as the etching mask.

Referring to FIG. 8, the gate insulating layer 160, the first semiconductor layer 140, and the second semiconductor layer 150 are sequentially stacked on the substrate 100 on which the gate electrode 170 is formed. The first semiconductor layer 140 and the second semiconductor layer 150 may be stacked utilizing a deposition method such as PVD, CVD, or the like.

In a manufacturing process of a display device including the thin film transistor, the first semiconductor layer 140 and the second semiconductor layer 150 may be patterned. In the patterning of the first semiconductor layer 140 and the second semiconductor layer 150, photoresist may be formed on the second semiconductor layer 150, a photoresist pattern may be formed by performing an exposure process using a mask on the photoresist, and the first semiconductor layer 140 and the second semiconductor layer 150 may be etched by using the photoresist pattern as an etching mask.

Referring to FIG. 9, the etch stopper 190 is formed on the second semiconductor layer 150. The etch stopper 190 is formed on an area to be the channel layer in the first semiconductor layer 140. Both ends of the second semiconductor layer 150 where the etch stopper 190 is not formed are exposed to the outside. The first source layer 121, the second source layer 122, the first drain layer 131, and the second drain layer 132 may be formed through at least one of a reducing reaction, a plasma processing reaction, and an impurity doping processing reaction onto an area exposed to the outside in the second semiconductor layer 150. That is, the source region 120 and the drain region 130 are thereby formed.

Figure 10:
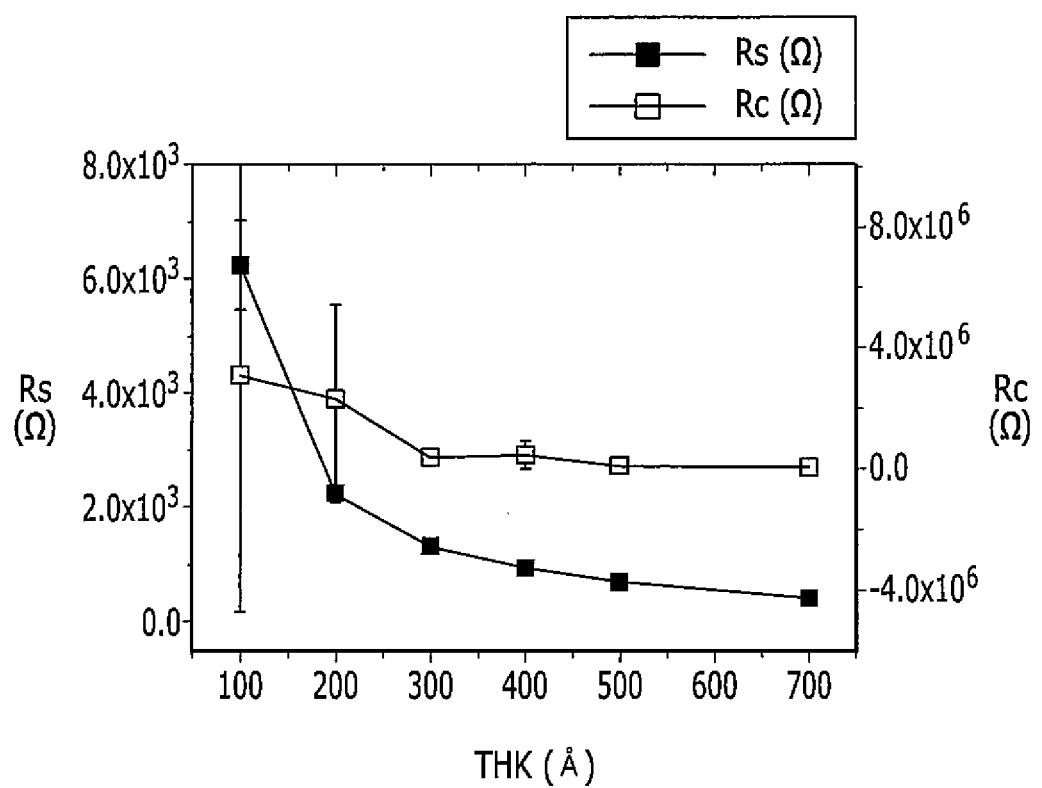
FIG. 10 is a graph illustrating sheet resistance $R_s$ and contact resistance $R_c$ versus the thickness of a semiconductor layer included in a thin film transistor.

FIG. 10 is a graph illustrating sheet resistance $R_s$ and contact resistance $R_c$ versus the thickness of a semiconductor layer included in a thin film transistor.

Referring to FIG. 10, as the thickness THK of the semiconductor layer decreases, sheet resistance Rs and contact resistance Rc increase. In particular, as the thickness THK of the semiconductor layer is equal to or less than 200 Å, the sheet resistance Rs increases significantly.

Even if the thickness of the second semiconductor layer 150 which becomes the channel layer is about (approximately) 100 Å in the top-gate thin film transistor according to an embodiment of the present invention, the thickness of the source region 120 and the drain region 130 is a thickness acquired by adding the thicknesses of the first semiconductor layer 140 and the second semiconductor layer 150, and as a result, the sheet resistance and the contact resistance of the source region 120 and the drain region 130 may have values corresponding to when the thickness THK is 200 Å.

Similarly, even if the thickness of the first semiconductor layer 140 which becomes the channel layer is approximately 100 Å in the bottom-gate thin film transistor according to another embodiment of the present invention, the thickness of the source region 120 and the drain region 130 is a thickness acquired by adding the thicknesses of the first semiconductor layer 140 and the second semiconductor layer 150, and as a result, the sheet resistance and the contact resistance of the source region 120 and the drain region 130 may have values corresponding to when the thickness THK is 200 Å.

That is, the sheet resistance and the contact resistance of the source region 120 and the drain region 130 may be decreased while implementing the channel layer of the oxide thin film transistor to be thin.

Figure 11:
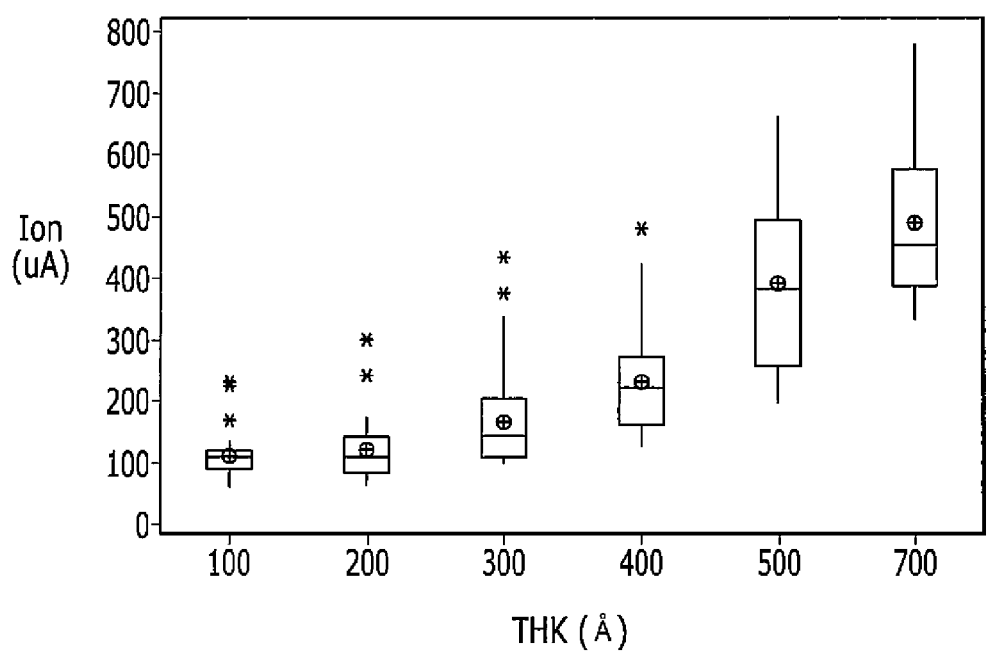
FIG. 11 is a graph illustrating operating current Ion of a thin film transistor versus the thickness of a semiconductor layer included in a thin film transistor.

FIG. 11 is a graph illustrating operating current Ion of a thin film transistor versus the thickness of a semiconductor layer included in the thin film transistor.

Referring to FIG. 11, as the thickness THK of the semiconductor layer decreases, operating current Ion of the thin film transistor and a distribution thereof decrease.

Since the sheet resistance and the contact resistance of the source region 120 and the drain region 130 may be decreased while implementing the channel layer of the oxide thin film transistor to be thin in the top-gate thin film transistor and the bottom-gate thin film transistor, the thickness THK of the second semiconductor layer 150 or the first semiconductor layer 140 which becomes the channel layer is formed to be thin (with 200 Å or less), thereby improving operating characteristics of the thin film transistor.

Figure 12:
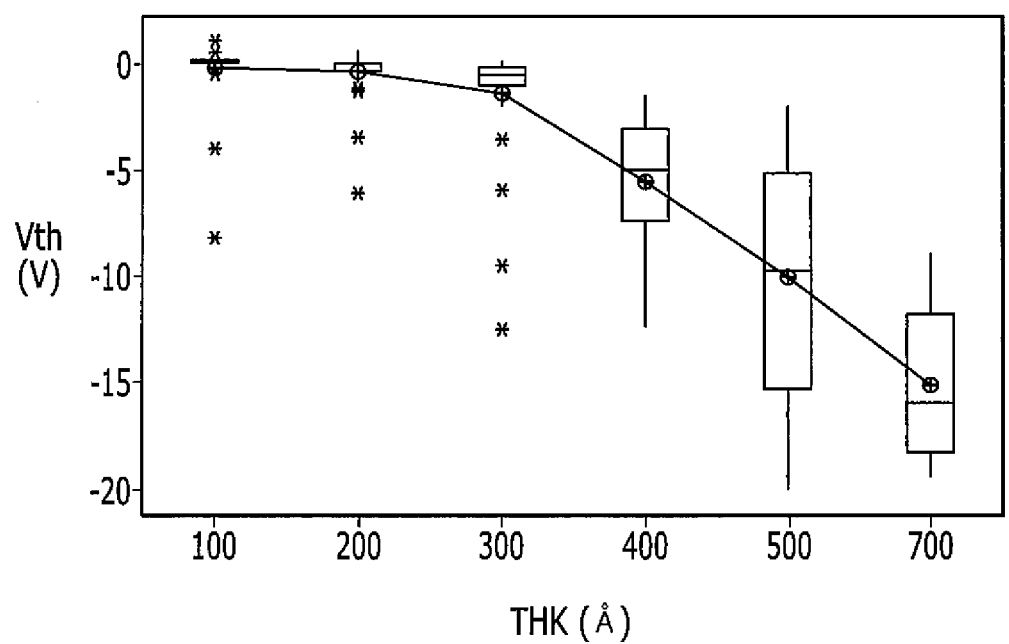
FIG. 12 is a graph illustrating a threshold voltage Vth of a thin film transistor versus the thickness of a semiconductor layer.

FIG. 12 is a graph illustrating threshold voltage Vth of a thin film transistor versus the thickness of a semiconductor layer.

Referring to FIG. 12, as the thickness THK of the semiconductor layer decreases, threshold voltage Vth of the thin film transistor and a distribution thereof decrease.

Since the sheet resistance and the contact resistance of the source region 120 and the drain region 130 may be decreased while implementing the channel layer of the oxide thin film transistor to be thin in the top-gate thin film transistor and the bottom-gate thin film transistor according to embodiments of the present invention, the thickness THK of the second semiconductor layer 150 or the first semiconductor layer 140 which becomes the channel layer can be formed to be thin (with 200 Å or less), thereby improving operating characteristics of the thin film transistor.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof. It is therefore desired that the present embodiments be considered in all respects as illustrative and not restrictive, reference being made to the appended claims and equivalents thereof, rather than the foregoing description to indicate the scope of the invention.

DESCRIPTION OF SYMBOLS

100: Substrate
110: Buffer layer
120: Source region
121: First source layer
122: Second source layer
130: Drain region
131: First drain layer
132: Second drain layer
140: First semiconductor layer
150: Second semiconductor layer
160: Gate insulating layer
170: Gate electrode
180: Passivation layer
190: Etch stopper

What is claimed is:

1. A thin film transistor, comprising:
a first semiconductor layer;
a second semiconductor layer on the first semiconductor layer;
a first source layer and a first drain layer,
wherein the entire first drain layer forms a first coplanar layer with the first semiconductor layer and does not overlap with the first semiconductor layer,
wherein the first drain layer a same thickness as the first semiconductor layer, and
wherein the first source layer and the first drain layer are at both sides of the first semiconductor layer;
a second source layer and a second drain layer,
wherein the entire second drain layer forms a second coplanar layer with the second semiconductor layer and does not overlap with the second semiconductor layer,
wherein the second drain layer has a same thickness as the second semiconductor layer,
wherein the second source layer and the second drain layer are at both sides of the second semiconductor layer, and
wherein only one of the first semiconductor layer and the second semiconductor layer is a transistor channel layer; and
a gate insulating layer directly formed on the second coplanar layer.

2. The thin film transistor of claim 1, wherein:
cations of the first semiconductor layer and the second semiconductor layer are the same as each other.

3. The thin film transistor of claim 1, further comprising:
a gate electrode on the gate insulating layer.

4. The thin film transistor of claim 3, wherein:
the second semiconductor layer is the channel layer.

5. The thin film transistor of claim 4, wherein:
a carrier concentration of the first semiconductor layer is lower than that of the second semiconductor layer.

6. The thin film transistor of claim 5, wherein:
the carrier concentration of the first semiconductor layer is equal to or less than $1\ e^{15}/cm^3$, and the carrier concentration of the second semiconductor layer is equal to or more than $1\ e^{17}/cm^3$.

7. The thin film transistor of claim 6, further comprising:
a source region comprising the first source layer and the second source layer; and
a drain region comprising the first drain layer and the second drain layer, wherein:
a carrier concentration of each of the source region and the drain region is equal to or more than $1\ e^{19}/cm^3$.

8. The thin film transistor of claim 4, wherein:
the first semiconductor layer comprises an insulating material dopable with impurities.

9. The thin film transistor of claim 4, wherein:
the first semiconductor layer functions as a light blocking layer.

* * * * *